United States Patent [19]

Gulczynski

[11] Patent Number: 4,940,982
[45] Date of Patent: Jul. 10, 1990

[54] HIGH SPEED INTEGRATING ANALOG-TO-DIGITAL CONVERTER

[76] Inventor: Zdzislaw Gulczynski, P.O. Box 441, Winchester, Mass. 01890

[21] Appl. No.: 251,171

[22] Filed: Jul. 30, 1988

Related U.S. Application Data

[63] Continuation-in-part of Ser. No. 20,783, Mar. 2, 1987, abandoned.

[30] Foreign Application Priority Data

Mar. 3, 1986 [DE] Fed. Rep. of Germany ....... 3606893

[51] Int. Cl.$^5$ ......................... H03M 1/46; H03M 1/56
[52] U.S. Cl. .................................... 341/169; 341/155; 341/156; 341/164
[58] Field of Search ............... 341/128, 156, 164, 169, 341/170, 155, 162

[56] References Cited

U.S. PATENT DOCUMENTS

| | | | |
|---|---|---|---|
| 3,750,142 | 7/1973 | Barnes et al. | 341/169 |
| 3,849,775 | 11/1974 | Buchanan et al. | 341/128 |
| 4,243,974 | 1/1981 | Mack | 341/164 |
| 4,544,918 | 10/1985 | De Hann | 341/156 |
| 4,565,992 | 1/1986 | Sakamoto et al. | 341/164 |
| 4,584,566 | 4/1986 | Arcara | 341/128 |
| 4,734,677 | 3/1988 | Cake et al. | 341/156 |
| 4,746,901 | 5/1988 | Smith | 341/156 |
| 4,829,302 | 5/1989 | Oitzl et al. | 341/156 |

*Primary Examiner*—William M. Shoop, Jr.
*Assistant Examiner*—Gary J. Romano

[57] ABSTRACT

Analog-to-digital converter is particularly for digital systems requiring a fast and accurate high resolution conversion of an analog input signal into a corresponding digital output code. A comparator compares the input signal against a ramp signal. A plurality of counters is responsive to the comparator for providing the output code. Each counter has a weight and counts subsequently to the counting of the counter having a higher weight. A digital-to-analog converter converts the output code from the counters into a reference signal prior to the counting of each counter. An integrator provides the ramp signal in reference to the reference signal and at a rate corresponding to the weight of the counter currently counting. A switch zeroes the integrator prior to the counting of each counter. An optional flash analog-to-digital converter estimates the input signal and determines an initial count of the counters.

18 Claims, 3 Drawing Sheets

HIGH SPEED INTEGRATING ANALOG-TO-DIGITAL CONVERTER

CROSS REFERENCE TO RELATED INVENTIONS

This is a continuation-in-part of application Ser. No. 020,783 filed Mar. 2, 1987, now abandoned.

This application is related to:
"Ultra Fast Logic with Temperature Compensation and Minimized Supply Voltage" Ser. No. 474,489 filed Feb. 2, 1990;
"Dual Flash Analog-to-Digital Converter" Ser. No. 316,592 filed Feb. 24, 1989;
"Dual Flash Analog-to-Digital Converter" Ser. No. 316,593 filed Feb. 24, 1989;
"Dual Flash Analog-to-Digital Converter" Ser. No. 316,594 filed Feb. 24, 1989;
"Ladderless True Flash Analog-to-Digital Converter with Automatic Calibration" Ser. No. 304,505 filed Jan. 31, 1989;
"Segmented Encoder and Digital Memory Particularly for Flash Analog-to-Digital Converters" Ser. No. 304,506 filed Jan. 31, 1989;
"Ultra Fast Digital-to-Analog Converter with Independent Bit Current Source Calibration" Ser. No. 304,507 filed Jan. 31, 1989;
"High Accuracy Reference Ladder" Ser. No. 304,510 filed Jan. 31, 1989;
"Flash Analog-to-Digital Converter with Integrating Input Stage" Ser. No. 248,495 filed Sept. 22, 1988;
"Encoder with Error Correction Particularly for Flash Analog-to-Digital Converters" Ser. No. 225,240 filed July 28, 1988;
"Sample-and-Hold Amplifier with Controllable Source Charger" Ser. No. 201,071 filed May 27, 1988;
"High Speed Integrating Digital-to-Analog Converter" Ser. No. 198,110 filed May 23, 1988;
"Ultra Fast Logic" Ser. No. 180,431 filed Apr. 12, 1988;
"High Seed Instrumentation Amplifier with Minimized Offset Voltage and Drift" U.S. Pat. No. 4,829,263 dated May 9, 1989;
"Digital-to-Analog Converter with Digital Correction" U.S. Pat. No. 4,843,392 dated June 27, 1989;
"Flash Analog-to-Digital Converter" U.S. Pat. No. 4,763,106 dated Aug. 9, 1988;
"Dual Flash Analog-to-Digital Converter" U.S. Pat. No. 4,857,931 dated Aug. 15, 1989;
"Digital-to-Analog Converter" U.S. Pat. No. 4,811,017 dated Mar. 7, 1989;
"Digital-to-Analog Converter" U.S. Pat. No. 4,837,572 dated June 6, 1989; and
"Operational Amplifier or Comparator Circuit with Minimized Offset Voltage and Drift" U.S. Pat. No. 4,749,953 dated June 7, 1988.

All inventions are by the same inventor.

BACKGROUND OF THE INVENTION

The present invention relates to integrating analog-to-digital converter (ADC), particularly for digital systems requiring a fast and accurate high resolution conversion of an analog input voltage or current into a corresponding digital output code.

Two groups of ADCs can be distinguished: indirect and direct ADCs. Integrating type ADCs operate by indirect conversion method as the input signal is converted into a ramp signal which is applied to a comparator. A time period is measured by counting clock pulses. Several variations such as single slope, multiple slope and charge balancing ADCs exist on the basic principle. For example in the single slope ADC ramp voltage of an integrator is rising from ground potential and is compared with the ADC input voltage by a comparator. If the comparator switches, a counter counting clock pulses is stopped, wherein the result of the conversion is available at its output. In the dual slope ADC the conversion begins when the input signal is applied to the integrator for a fixed period of time determined by counting of a counter. Subsequently, the direction of the ramp signal is reversed. A reference voltage of an opposite polarity is applied to the integrator until the ramp voltage is back to zero. The counting is stopped when the zero crossing is detected by a comparator. The counter output represents the ADC output code.

The direct ADCs immediately digitize the input signal. Flash, multiple flash and successive approximation ADCs fall into this group. For example, in the dual flash ADC the input voltage is converted into most significant bits (MSBs) which are further converted by a digital-to-analog converter (DAC) into voltage. This voltage is subtracted from the input voltage, the result is amplified and further converted into least significant bits (LSBs). The MSBs and LSBs represent the ADC output code.

The integrating ADCs have a very high accuracy, large noise rejection, ability of an effective suppressing periodic interference signals, extremely small nonlinearities, inherent monotonicity and virtually no missing codes. They are surpassed by the direct ADCs only in a high maximum conversion speed.

SUMMARY OF THE INVENTION

The invention is intended to provide an ADC having the advantages of the integrating ADCs as well as a very high conversion speed.

According to the present invention ADC converts input signal into output code and comprises a comparator means for comparing the input signal against a ramp signal, a plurality of counter means responsive to the comparator means for providing the output code, each counter means having a weight and counting subsequently to the counting of the counter means having a higher weight, a DAC means for converting the output code from the counter means into a reference signal prior to the counting of each counter means, an integrator means for providing the ramp signal in reference to the reference signal and at a rate corresponding to the weight of the counter means currently counting, and a switch means for zeroing the integrator means prior to the counting of each counter means.

In another embodiment ADC converts input signal into output code and comprises a comparator means for comparing the input signal against a ramp signal, a plurality of counter means responsive to the comparator means for providing the output code, each counter means having a weight and counting subsequently to the counting of the counter means having a higher weight, an integrator means for providing the ramp signal at a rate corresponding to the weight of the counter means currently counting, and a switch means for zeroing the integrator means prior to the counting of any counter means.

In yet another embodiment the integrator means includes a source means for providing a current and a capacitor means for integrating the current, wherein the switch means zeroes the capacitor means. The result of the integrator means zeroing is the output signal of the integrator means set by the input signal applied thereto.

BRIEF DESCRIPTION OF THE DRAWINGS

The present invention will become more clear in conjunction with the accompanying figures of which.

Throughout the drawings similar references denote similar parts.

DETAILED DESCRIPTION OF THE INVENTION

Figure 1:
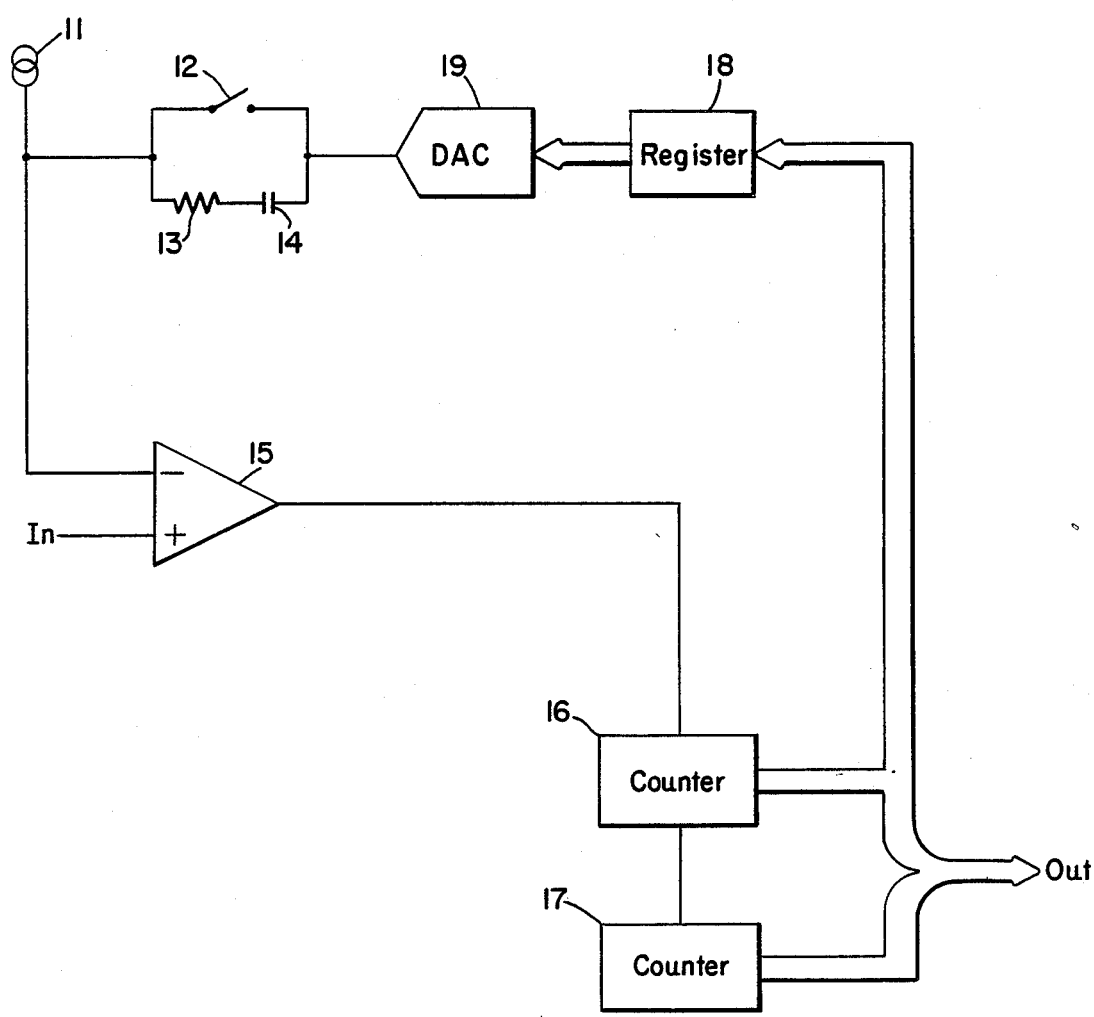
FIG. 1 is an embodiment with the integrator referenced to output of the DAC.

FIG. 1 is an embodiment with the integrator referenced to output of the DAC. The comparator 15 compares the ADC input signal against a ramp signal. A plurality of counters is responsive to the comparator 15 and provides the ADC output code. Two counters 16 and 17 are shown for simplicity. The register 18 stores at least a portion of the ADC output code provided by the counters 16 and 17 prior to the counting of each counter. The DAC 19 converts the respective code into a reference signal. By these means, the output of the counters 16 and 17 may vary while the reference signal remains stable. The DAC 19 is coupled in the feedback loop of the ADC. Thereby, any inaccuracies of the comparator 15 and integrator are eliminated in most critical areas, i.e. for any ramp signal rate except the smallest one.

The counters 16 and 17 successively count pulses of an oscillator in descending order with respect to the their weights. Moreover, each counter provides a portion of the ADC output code which portion has a binary weight corresponding to the weight of the counter. Specifically, the counter 17 has a lower weight than counter 16 and therefore counts subsequently to the counting thereof. The counters 16 and 17 provide respectively MSBs and LSBs of the ADC output code.

The integrator includes the controllable current source 11 for providing a current which has a value corresponding to the weight of the counter currently counting and the capacitor 14 for integrating the current. The current source 11 is coupled to inverting input of the comparator 15. The capacitor 14 is coupled between the current source 11 and output of the DAC 19. By these means the integrator provides the ramp signal in reference to the reference signal of the DAC 19 and at a rate corresponding to the weight of the counter currently counting. In particular, the rate is proportional to that weight. The switch 12 zeroes the integrator by zeroing capacitor 14 prior to the counting of each counter.

The rate of the ramp signal is also proportional to $J/C$, wherein $J$ is the current provided by the current source 11 and $C$ is the capacitance of the capacitor 14. The rate is altered preferably by controlling the current while the capacitance is fixed. Altering the capacitance would require an employment of at least one switch. For instance, on-resistance thereof would introduce new errors. The direction of the ramp signal is determined by the current direction of the source 11.

The operation of the ADC will become more clear by analyzing an example of 8-bit ADC converting input signal equal 1 V. For the purpose of clarity, full scale range (FSR) is 2.56 V so that 0.01 V of the ADC input signal corresponds to 1 LSB of the ADC output code. The counters 16 and 17 have weights 16 and 1, and provide 4 MSBs and 4 LSBs of the ADC output code respectively. An initial count of the counters 16 and 17 corresponding to an estimate value of the ADC input signal results in a reduced conversion time. Therefore, the counter 16 is preset to 1000 and counter 17 is reset, whereby the initial count equal 10000000 corresponds to half the FSR.

The register 18 stores only 4 bits from the counter 16 as the counter 17 is initially reset and starts the counting after the conversion in the DAC 19. Consequently, the DAC 19 receives only the respective 4 bits, wherein the remaining 4 bits are 0000. Therefore, the DAC 19 converts the initial code equal 10000000 into the corresponding reference signal equal 1.28 V. Moreover, the DAC 19 must provide the reference signal accurate to at least 8 bits only for the final, i.e. second, conversion when the ramp signal rate is the smallest.

The switch 12 is coupled in parallel with the capacitor 14 via the resistor 13 for zeroing the capacitor 14 prior to the counting of each counter. Thereby, the ramp signal is initially equal 1.28 V. The current of the current source 11 can be interrupted during the zeroing if on-resistance of the switch 12 results in a considerable voltage drop thereacross. The comparator 15 compares the ADC input signal against the ramp signal and determines a direction of the counting and a direction of the ramp signal.

Subsequently, the ramp signal advances while the counter 16 counts pulses of the oscillator, starting at a pulse edge. The counter 16 counts down and ramp signal goes down since the ADC input signal is smaller than the ramp signal. Due to the weight of the counter 16, one count thereof corresponds to 0.16 V. When the ramp signal is $1.28 \text{ V} - 0.16 \text{ V} = 1.12 \text{ V}$, the count of the counter 16 is decremented by one. When the ramp signal is equal 1 V, the comparator 15 switches. The counting of the counter 16 is stopped, whereby the count thereof remains equal 0111.

The pattern is repeated, whereas the counter 17 having the lower weight than counter 16 is enabled for counting. Specifically, the register 18 stores the code 0111 and DAC 19 converts the code 01110000 into the corresponding reference signal equal 1.12 V. The switch 12 zeroes the capacitor 14, whereby the ramp signal is equal 1.12 V. Subsequently, the ramp signal advances while the counter 17 counts pulses of the oscillator, starting at a pulse edge. The counter 17 counts down and ramp signal goes down since the ADC input signal is smaller than the ramp signal. Due to the weight of the counter 17, one count thereof corresponds to 0.01 V, i.e. the rate of the ramp signal is now reduced 16 times. When the ramp signal is $1.12 \text{ V} - 0.01 \text{ V} = 1.11$ V, the count of the counter 17 is decremented by one. When the ramp signal is equal 1 V, the comparator 15 switches. The counting of the counter 17 is stopped, whereby the count thereof is equal 0100.

The counter 17 was initially reset. When the count thereof was decremented by one to 1111, the counter 17 provided an overflow signal to the counter 16 having the higher weight. In accordance with the counting direction of the counter 17, the count of the counter 16 was decremented by one to 0110. Therefore, the final counts of the counters 16 and 17 are 0110 and 0100 respectively. The 1 V ADC input signal is converted into the corresponding ADC output code equal 01100100.

The resistor 13 is coupled in series with the capacitor 14. When the switch 12 is open, the current of source 11 flows thru the resistor 13. The voltage drop thereacross depends on the current and has an effect as offset voltage of the comparator 15. As a result, the comparator switches sooner which reduces the overall delay time between coincidence of the comparator input signals and stopping of the respective counter. Upon the condition T=RC, the voltage across the capacitor 14 reaches a value as if the delay time was zero, independently of the current of the current source 11. T, R and C are the values of the delay time, resistance of the resistor 13 and capacitance of the capacitor 14 respectively.

Moreover, unidirectional current source 11 and unidirectional counters 16, 17 can be employed. Both counters 16 and 17 can be initially reset. The resistor 13 simulates a higher voltage across the capacitor 14 while the current of the source 11 flows therethrough. The counters 16 and 17 are stopped sooner. The count thereof is smaller, whereby the reference signal provided by the DAC 19 is smaller than the ADC input signal. The resistor 13 also limits the current flowing thru the switch 12 during the zeroing of the capacitor 14.

Figure 2:
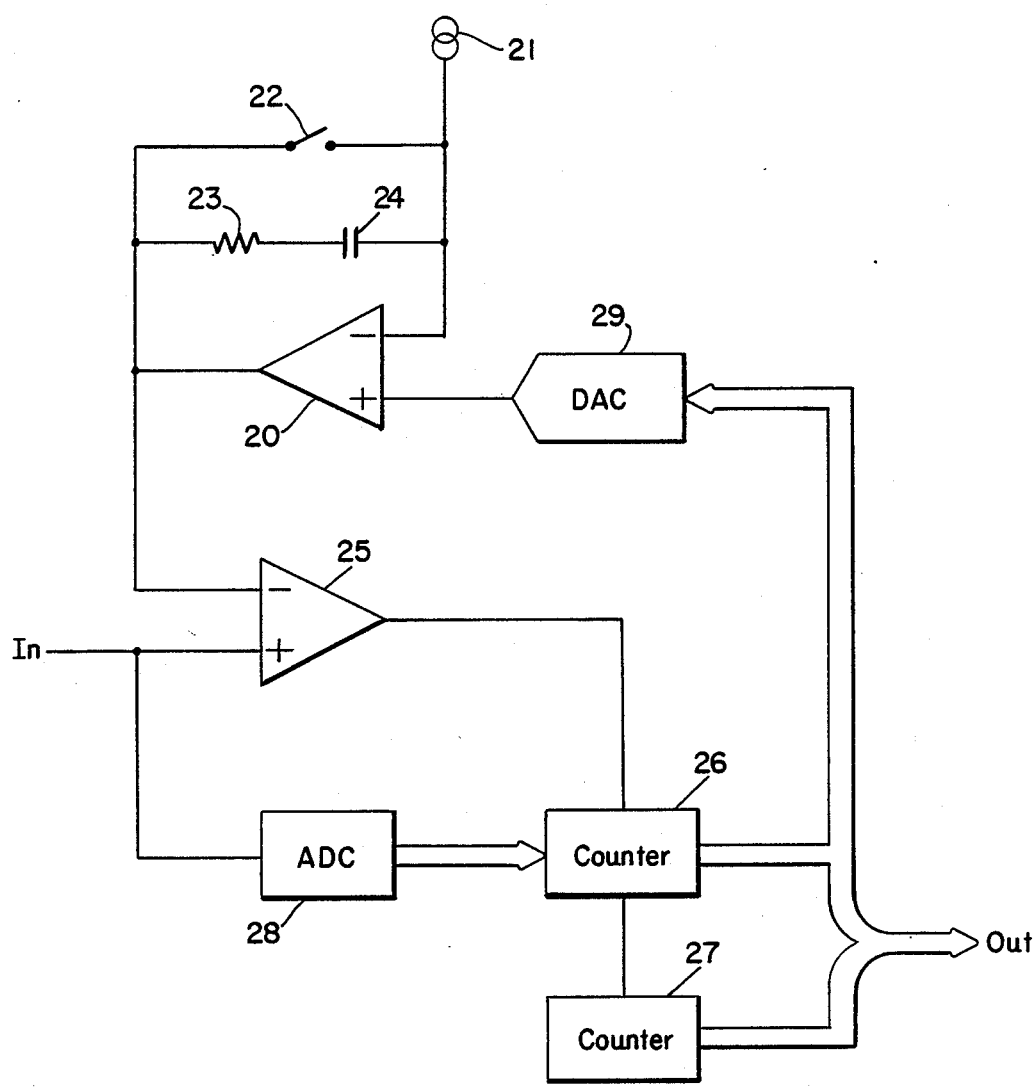
FIG. 2 is another embodiment with the integrator referenced to output of the DAC and with an ADC for determining an initial count of the counters.

FIG. 2 is another embodiment with the integrator referenced to output of the DAC and with an ADC for determining an initial count of the counters. The ADC comprises the components 21 thru 27 coupled and operating similarly to respectively 11 thru 17 of FIG. 1. In particular, the comparator 25 compares the ADC input signal against a ramp signal. The counters 26 and 27 are responsive to the comparator 25 and provide respectively MSBs and LSBs of the ADC output code. The DAC 29 comprises an internal register which stores at least a portion of the ADC output code prior to the counting of each counter. The respective code is further converted into a reference signal. The counter 27 has a lower weight than counter 26 and therefore counts subsequently to the counting thereof.

The integrator includes the controllable current source 21 for providing a current which has a value corresponding to the weight of the counter currently counting and the capacitor 24 for integrating the current. The integrator further includes the operational amplifier (OA) 20 having an inverting input and output coupled across the capacitor 24, and a noninverting input coupled to the reference signal. The current source 21 is coupled to the inverting input of the OA 20.

The output impedance of the DAC 29 is insignificant as the output thereof is coupled to the high impedance noninverting input of the OA 20. Similarly, the inverting input impedance of the comparator 25 is insignificant as the inverting input thereof is coupled to the output of the OA 20. The OA 20 provides the ramp signal in reference to the reference signal of the DAC 29 and at a rate corresponding to the weight of the counter currently counting. The rate and direction of the ramp signal is altered by controlling respectively the current value and current direction of the current source 21.

The switch 22 is coupled in parallel with the capacitor 24 via the resistor 23 for zeroing the capacitor 24 prior to the counting of each counter. The resistor 23 is coupled in series with the capacitor 24 for causing an earlier switching of the comparator 25. As a result, the overall delay time between coincidence of the comparator input signals and stopping of the respective counter is reduced. Moreover, unidirectional current source 21 and unidirectional counters 26, 27 can be employed.

The conversion time can be significantly reduced by determining the initial count which corresponds to an estimate value of the ADC input signal. In the above numeric example, the counters 16 and 17 are initially preset to 1000 and reset respectively, whereby the initial count corresponds to half the FSR. Consequently, the DAC 19 converts the initial count into the corresponding reference signal equal half the FSR. For a significantly more accurate estimation the ADC 28 of any type can be used, wherein flash ADC results in a highest conversion speed. The ADC 28 converts the ADC input signal into a code which is loaded into the counter 26 while the counter 27 is reset. However, ADC 28 having a higher resolution can be employed to determine the initial count of both counters 26 and 27. The initial count is converted by the DAC 29 into the reference voltage prior to the counting of any counter.

Figure 3:
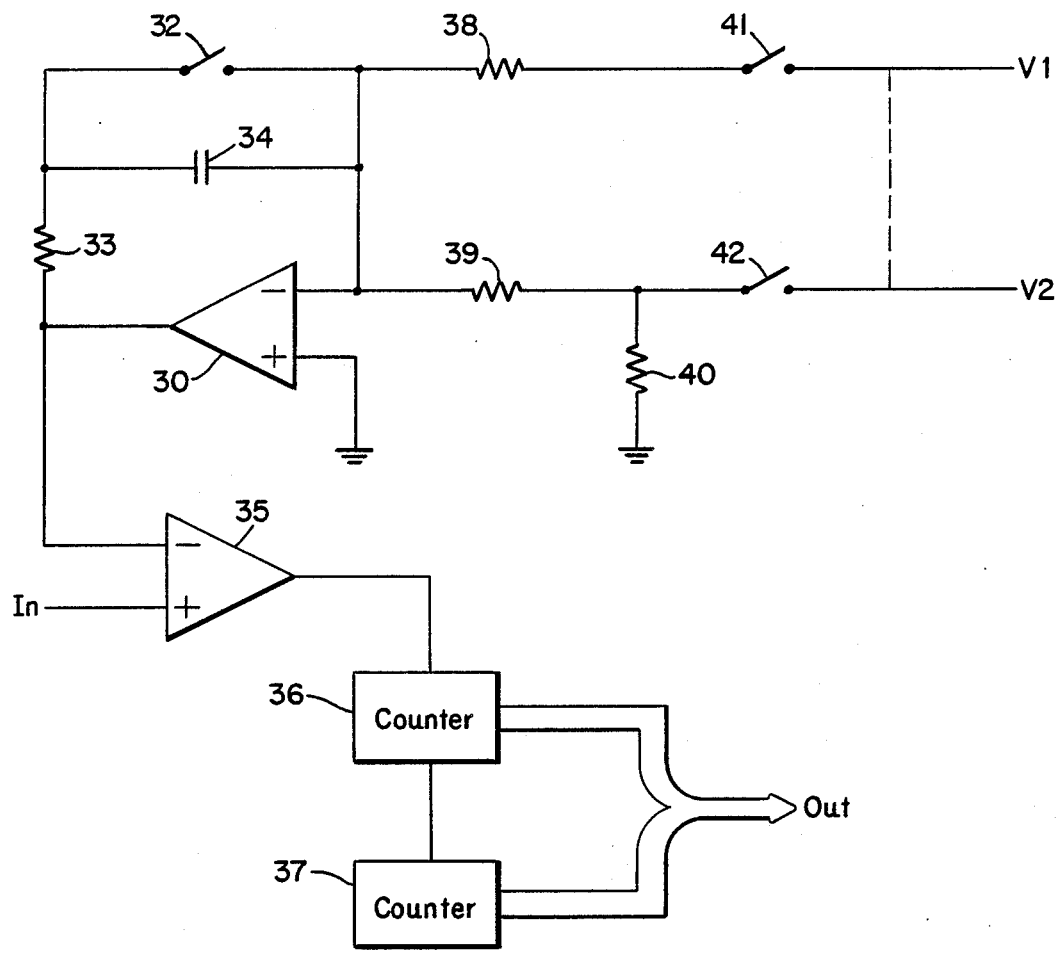
FIG. 3 is an embodiment with the integrator referenced to ground.

FIG. 3 is an embodiment with the integrator referenced to ground. The comparator 35 compares the ADC input signal against a ramp signal. A plurality of counters is responsive to the comparator 35 and provides the ADC output code. Two counters 36 and 37 are shown for simplicity. The counter 37 has a lower weight than counter 36 and therefore counts subsequently to the counting thereof. Each counter provides a portion of the ADC output code which portion has a binary weight corresponding to the weight of the counter. An integrator provides the ramp signal at a rate corresponding to the weight of the counter currently counting. In particular, the rate is proportional thereto. The comparator 35 determines a direction of the counting and a direction of the ramp signal.

The integrator includes a source means for providing a current to the capacitor 34 which integrates it. The OA 30 has the inverting input and output coupled across the capacitor 34, and a noninverting input coupled to ground. The output of the OA 30 is coupled to the inverting input of the comparator 35. The source means includes the voltage sources V1, V2 and switches 41, 42 respectively coupled in series therewith. The resistors 38 and 39 are coupled in series with the switches 41 and 42 respectively, and further to the inverting input of the OA 30 for attaining the current. The switch 32 zeroes the integrator prior to counting of any counter by zeroing the capacitor 34.

The operation of the ADC will become more clear by analyzing operation of 8-bit ADC consistent with the above numeric example. The counters 36 and 37 have weights 16 and 1, and provide 4 MSBs and 4 LSBs of the ADC output code respectively. The counters 36 and 37 are initially reset. The switches 41 and 42 are open and switch 32 is momentarily closed for zeroing the capacitor 34 coupled in parallel therewith. Thereby, the ramp signal is initially equal 0 V. The comparator 35 compares the ADC input signal against the ramp signal and determines a direction of the counting and a direction of the ramp signal.

Subsequently, the switch 41 is closed while the counter 36 counts pulses of an oscillator, starting at a pulse edge. The counter 36 counts up since the ADC input signal is greater than the ramp signal. Similarly, the ramp signal goes up as voltage of the source V1 is negative. Due to the weight of the counter 36, one count thereof corresponds to 0.16 V. When the ramp signal is equal 1 V, the comparator 35 switches. The switch 41 is open and counting of the counter 36 stopped when the count thereof is incremented, i.e. on a next pulse edge. Thereby, the ramp signal is 1.12 V and the count of the counter 36 is 0111.

The pattern is repeated, whereas the counter 37 having the lower weight than counter 36 is enabled for counting. Specifically, the switch 42 is closed while the counter 37 counts pulses of the oscillator, starting at a pulse edge. The counter 37 counts down since the ADC input signal is smaller than the ramp signal. Similarly, the ramp signal goes down as voltage of the source V2 is positive. Due to the weight of the counter 37, one count thereof corresponds to 0.01 V, i.e. the rate of the ramp signal is now reduced 16 times. When the ramp signal is equal 1 V, the comparator 35 switches. The switch 42 is open and counting of the counter 37 stopped when the count thereof is decremented. Thereby, the final count of the counter 37 is 0100.

The counter 37 was initially reset. When the count thereof was decremented by one to 1111, the counter 37 provided an overflow signal to the counter 36 having the higher weight. In accordance with the counting direction of the counter 37, the count of the counter 36 was decremented by one to 0110. Therefore, the final counts of the counters 36 and 37 are 0110 and 0100 respectively. The 1 V ADC input signal is converted into the corresponding ADC output code equal 01100100, the same as in the previous numeric example.

The resistor 33 is coupled in series with the capacitor 34 and simulates a higher voltage thereacross when the switch 41 or 42 is closed. The voltage drop across the resistor 33 has an effect as offset voltage of the comparator 35. As a result, the comparator switches sooner which reduces the overall delay time, similarly to the effect of resistors 13 and 23 of FIGS. 1 and 2 respectively. Moreover, the source V2 can be replaced by V1 and unidirectional counters 36, 37 can be employed. The switch can be also coupled directly to the output of the OA 30. The value of the resistor 39 is higher than of resistor 38. Therefore, the resistor 40 is coupled between the switch 42 and ground to enforce equal on-currents of the switches 41 and 42.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Analog-to-digital converter for converting input signal into output code, comprising:
   a comparator means for comparing the input signal against a ramp signal;
   a plurality of counter means responsive to the comparator means for providing the output code, each counter means having a weight and counting subsequently to the counting of the counter means having a higher weight;
   a digital-to-analog converter means for converting the output code into a reference signal;
   an integrator means for providing the ramp signal in reference to the reference signal and at a rate corresponding to the weight of the counter means currently counting; and
   a switch means for zeroing the integrator means.

2. Analog-to-digital converter of claim 1, wherein the integrator means includes:
   a source means for providing a current; and
   a capacitor means for integrating the current,
   wherein the switch means zeroes the capacitor means.

3. Analog-to-digital converter of claim 2, wherein the capacitor means is coupled between the reference signal and source means.

4. Analog-to-digital converter of claim 2, wherein the integrator means includes an operational amplifier having an inverting input and output coupled across the capacitor means, and a noninverting input coupled to the reference signal.

5. Analog-to-digital converter of claim 2, wherein the capacitor means includes a series coupled resistor.

6. Analog-to-digital converter of claim 1, wherein the comparator means determines a direction of the counting and a direction of the ramp signal.

7. Analog-to-digital converter of claim 1, wherein each counter means provides a portion of the output code which portion has a binary weight corresponding to the weight of the counter means, and
   further wherein the rate of the ramp signal is proportional to the weight of the counter means currently counting.

8. Analog-to-digital converter of claim 1, wherein at least one counter means provides an overflow signal to the counter means having the higher weight.

9. Analog-to-digital converter of claim 1, further including an analog-to-digital converter means for determining an initial count of the counter means which initial count corresponds to an estimate value of the input signal.

10. Analog-to-digital converter of claim 1, wherein the digital-to-analog converter means includes a register means for storing at least a portion of the output code.

11. Analog-to-digital converter for converting input signal into output code, comprising:
    a comparator means for comparing the input signal against a ramp signal;
    a plurality of counter means responsive to the comparator means for providing the output code, each counter means having a weight and counting subsequently to the counting of the counter means having a higher weight;
    an integrator means for providing the ramp signal at a rate corresponding to the weight of the counter means currently counting; and
    a switch means for zeroing the integrator means.

12. Analog-to-digital converter of claim 11, wherein the integrator means includes:
    a source means for providing a current; and
    a capacitor means for integrating the current,
    wherein the switch means zeroes the capacitor means.

13. Analog-to-digital converter of claim 12, wherein the integrator means includes an operational amplifier having an inverting input and output coupled across the capacitor means, and a noninverting input coupled to ground.

14. Analog-to-digital converter of claim 13, wherein the source means includes:
    a voltage source means for providing a voltage; and
    a resistive means coupled in series with the voltage source means for attaining the current.

15. Analog-to-digital converter of claim 12, wherein the capacitor means includes a series coupled resistor.

16. Analog-to-digital converter of claim 11, wherein the comparator means determines a direction of the counting and a direction of the ramp signal.

17. Analog-to-digital converter of claim 11, wherein each counter means provides a portion of the output code which portion has a binary weight corresponding to the weight of the counter means, and
further wherein the rate of the ramp signal is proportional to the weight of the counter means currently counting.

18. Analog-to-digital converter of claim 11, wherein at least one counter means provides an overflow signal to the counter means having the higher weight.

* * * * *